(12) United States Patent
Edwards et al.

(10) Patent No.: US 7,687,856 B2
(45) Date of Patent: Mar. 30, 2010

(54) BODY BIAS TO FACILITATE TRANSISTOR MATCHING

(75) Inventors: Henry Litzmann Edwards, Garland, TX (US); Tathagata Chatterjee, Allen, TX (US); Mohamed Kamel Mahmoud, Wylie, TX (US); Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 11/746,887

(22) Filed: May 10, 2007

(65) Prior Publication Data

US 2008/0277731 A1  Nov. 13, 2008

(51) Int. Cl.
*H01L 29/02* (2006.01)
*H01L 29/04* (2006.01)

(52) U.S. Cl. ............ 257/344; 257/345; 257/408; 257/E29.012; 257/E29.278; 257/E21.618; 257/E21.633

(58) Field of Classification Search .......... 257/344, 257/345, 408, E29.012, E29.278, E21.436, 257/E21.618
See application file for complete search history.

(56) References Cited

U.S. PATENT DOCUMENTS 5,659,504 A * 8/1997 Bude et al. ............ 365/185.27
6,368,918 B2 * 4/2002 Cunningham et al. ....... 438/260
2004/0023478 A1 * 2/2004 Samavedam et al. ........ 438/592
2008/0067589 A1 * 3/2008 Ito et al. ..................... 257/344

OTHER PUBLICATIONS

"Impact of pocket implant on MOSFET mismatch for advanced CMOS technology", K. Rochereau, R. Difrenza, J. McGinley, O. Moblanc, C. Julien, S. Parihar and P. Llinares, Proc. IEEE 2004 Int. Conference on Microelectronic Test Structures, vol. 17, Mar. 2004, 4 pgs.
"Optimizing the Match in Weakly Inverted MOSFET's by Gated Lateral Bipolar Action", Ming-Jer Chen and Dang-Yang Chang, IEEE Transactions on Electron Devices, vol. 43, No. 5, May 1996, pp. 766-773.

* cited by examiner

*Primary Examiner*—Ngan Ngo
*Assistant Examiner*—Benjamin Tzu-Hung Liu
(74) *Attorney, Agent, or Firm*—Warren L. Franz; Wade J. Brady, III; Frederick J. Telecky, Jr.

(57) ABSTRACT

One embodiment of the present invention relates to a method for transistor matching. In this method, a channel is formed within a first transistor by applying a gate-source bias having a first polarity to the first transistor. The magnitude of a potential barrier in a pocket implant region of the first transistor is reduced by applying a body-source bias having the first polarity to the first transistor. Current flow is facilitated across the channel by applying a drain-source bias having the first polarity to the first transistor. Other methods and circuits are also disclosed.

12 Claims, 11 Drawing Sheets

BODY BIAS TO FACILITATE TRANSISTOR MATCHING

FIELD OF INVENTION

The present invention relates generally to semiconductor devices and more particularly to methods and systems for providing matched transistors.

BACKGROUND OF THE INVENTION

In many integrated circuits, designers go to great lengths to match the characteristics of transistors. For example, designers typically match the transistors' geometries (i.e., layouts) so that the transistors experience similar electrical stresses with respect to surrounding devices. Depending on design constraints, designers may want to match the gains ($\beta$), currents delivered ($I_{DS}$), voltage thresholds ($V_T$), or other transistor characteristics of two or more transistors. Historically, however it has been very difficult to achieve good matching between devices.

Accordingly, there remains a need for matched transistors and methods for providing matched transistors.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method for transistor matching. In this method, a channel is formed within a first transistor by applying a gate-source bias having a first polarity to the first transistor. The magnitude of a potential barrier in a pocket implant region of the first transistor is reduced by applying a body-source bias having the first polarity to the first transistor. Current flow is facilitated across the channel by applying a drain-source bias having the first polarity to the first transistor.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

Figure 1A:
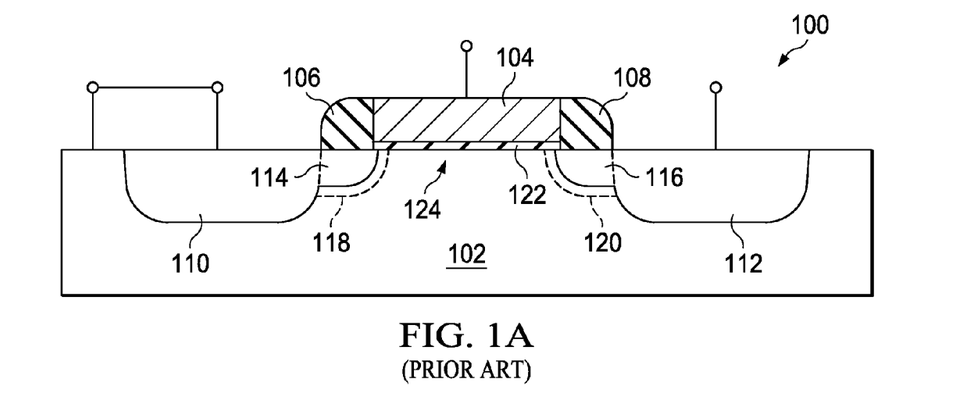
FIGS. 1A-1C relate to a method for utilizing a transistor in accordance with the prior art.
Figure 1B:
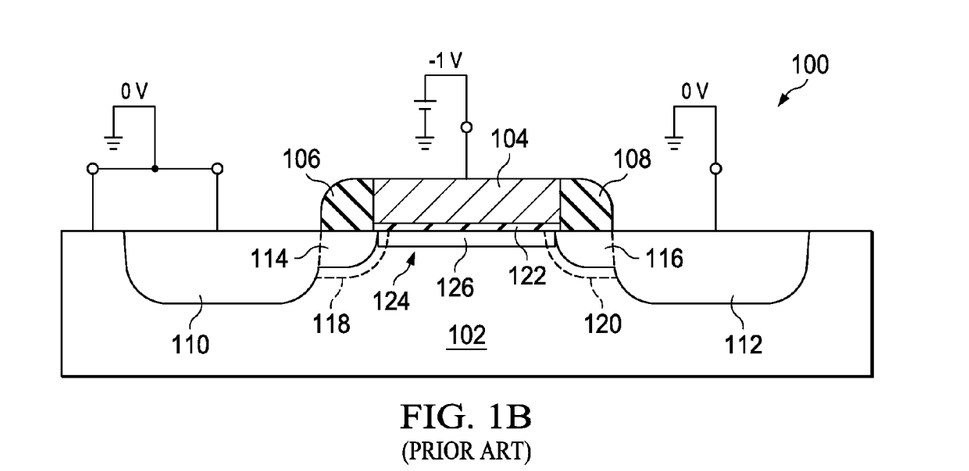
Figure 1C:
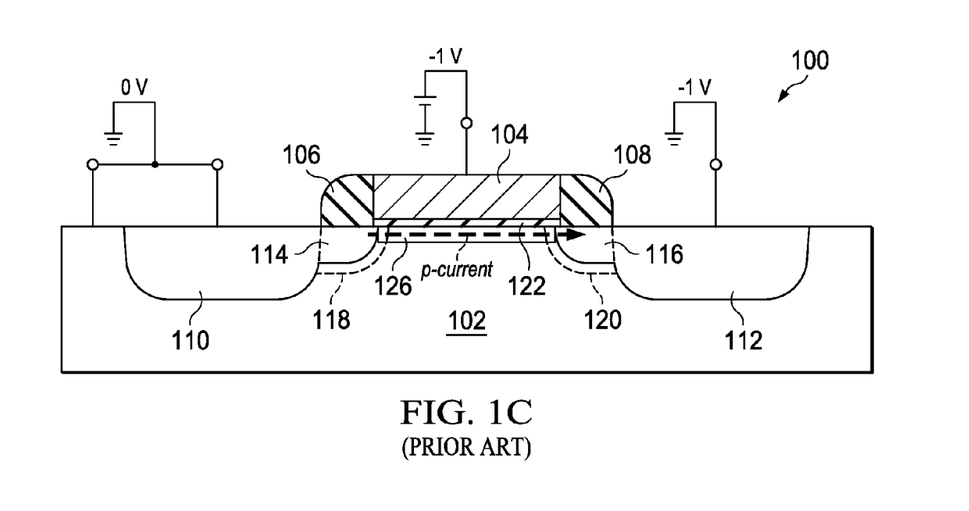

Referring now to FIG. 1A-1C, one can see a metal-oxide semiconductor field effect transistor 100 (MOSFET) in accordance with the prior art. Generally speaking, such MOSFETs may be useful in both digital applications (i.e., where the device typically represents one of two states, namely "1" and "0") and analog applications (i.e., where the device represents a continuum of values). Briefly, the illustrated transistor 100 is a semiconductor device formed over a semiconductor body 102. The transistor 100 includes a gate-electrode 104, spacers 106, 108 disposed about the lateral edges of the gate-electrode, and a source 110 and drain 112. In addition, drain-source extensions 114, 116; and pocket implant regions 118, 120 are disposed substantially under the spacers 106, 108, respectively. A dielectric 122 insulates the gate electrode 104 from a channel region 124 within the body, which dielectric 122 allows a gate-source bias to be either negative or positive, depending on whether the device is p-type or n-type, respectively. The source 110 is tied to the body 102.

More specifically, FIG. 1A will be discussed herein as a p-type transistor (PMOS) formed over an n-type body 102 (which could typically be either an n-type substrate or an n-well formed within a p-type substrate). Thus, in this embodiment, the source 110 and drain 112 are p-type regions (as are the drain-source extensions 114, 116), while the pocket implant regions 118, 120 are n-type. Positively charged holes are typically the majority carriers. The PMOS shown in FIG. 1A is a long-channel PMOS, in the sense that the pocket implants do not overlap as they do in a PMOS with a smaller gate length.

As described in more detail below with reference to FIGS. 1B-1C, a two step process is used to provide current from the illustrated PMOS device. First, a channel 126 is formed within the body under the gate electrode (i.e., in the channel region 124) (FIG. 1B). Second, the transistor 100 is biased to sweep carriers across the channel, thereby inducing current flow (FIG. 1C).

Referring now to FIG. 1B, one can see that during the formation of the channel 126, the source 110 is grounded at 0 V and a negative voltage of −1 V is applied to the gate electrode 104. Because the voltage is effectively applied between the source 110 and the gate 104, such a bias condition may be referred to as a "gate-source bias." The negative voltage on the gate causes negatively charged free electrons in the body to be repelled from the channel region 124, and causes positively charged holes accumulate in the channel region 124. Therefore, a p-type channel 126 that includes positively charged holes as the majority carriers is said to connect the source and drain. Thus, FIG. 1B shows a channel 126 in which current can flow.

Referring now to FIG. 1C, while the channel 126 (which includes positively charged holes) is present, a negative voltage of −1V is applied to the drain 112 relative to the source 110. Such a voltage may also be referred to as a "drain-source" voltage. In the PMOS device 100, this negative voltage will "sweep" the positively charged holes from the source 110 across the channel 126 and towards the negatively charged drain 112, thereby causing holes (p-current) to flow.

Figure 2A:
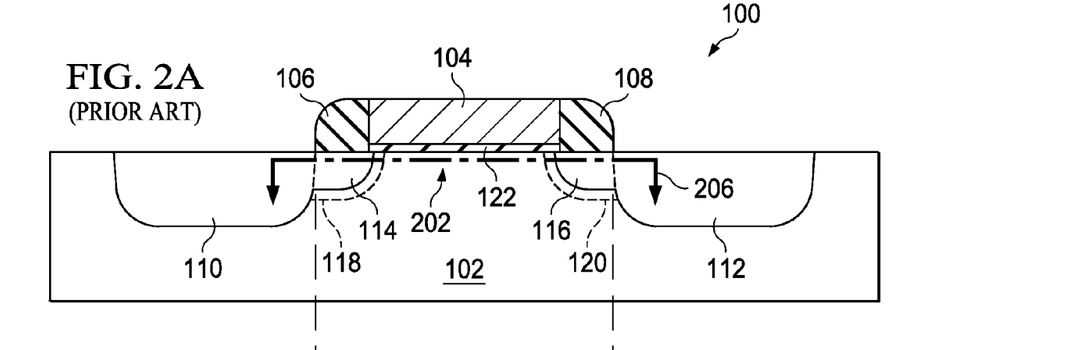
FIGS. 2A-2C show a cross-sectional view of a prior art transistor, its doping profile, and its potential between its source and drain.
Figure 2B:
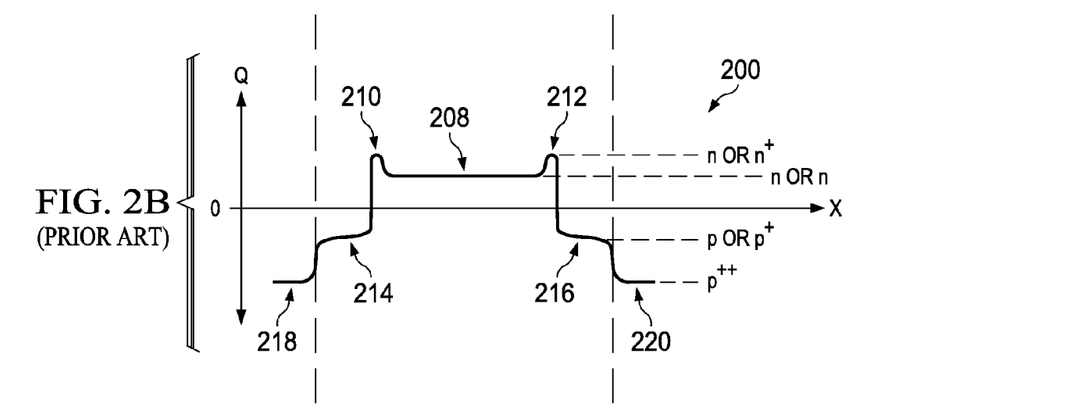
Figure 2C:
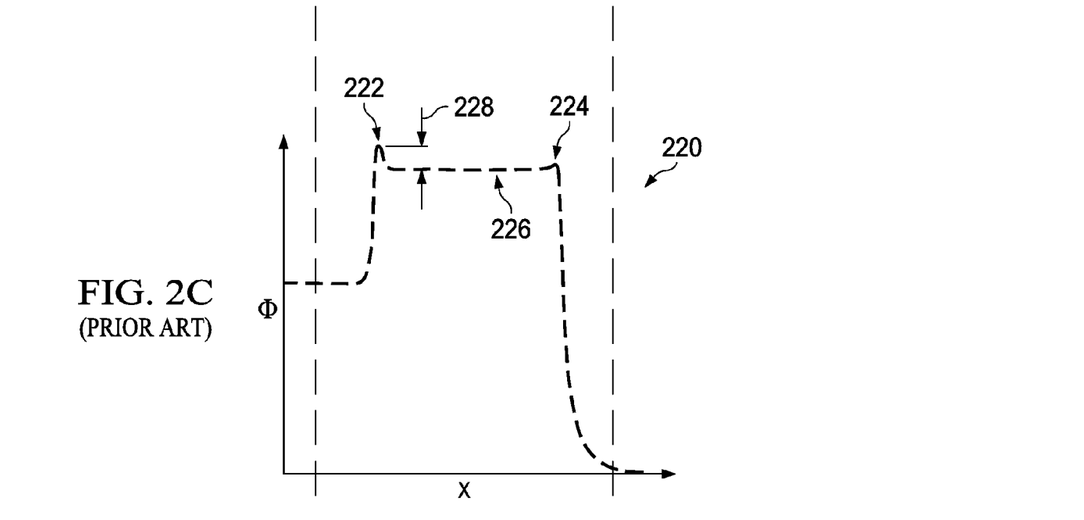

As mentioned, in complex semiconductor chips employing multiple transistors, designers often require that the characteristics of one transistor match the characteristic of another transistor on the same chip. FIGS. 2A-2C show one reason why it is difficult to "match" two transistors even if their layouts are identical. More particularly, these figures illustrate how the pocket implant regions 118, 120 make matching difficult. FIG. 2A shows the PMOS transistor 100 as previously discussed, and FIG. 2B shows the doping profile 200 taken along cut-away line 206. Generally speaking, the region in the body under the gate may be referred to as the "bulk region" 202, which is flanked by the pocket implant regions 118, 120. The doping profile 200 exhibits a relatively constant doping concentration 208 (n– or n) under the bulk region 202, and has doping concentration peaks 210, 212 (n or n+) that correspond to the pocket implant regions 118, 120, respectively. Relatively light doping concentration regions 214, 216 (p or p+) correspond to the source-drain extension regions 114, 116, and relatively high magnitude doping concentration regions 218, 220 (p++) correspond to the source 110 and drain 112.

In FIG. 2C, in which the device is in the off-state (accumulation state) and $V_{DS}$ has been applied, one can see the large potential barrier 220 experienced by the carriers (e.g., holes) as they flow from source to drain, consistent with the off-state biasing. Notably, there are smaller pocket potential barriers 222, 224 associated with the pocket implant regions 210, 212, respectively, and a bulk potential 226 associated with the bulk region 202. These pocket potential barriers 222, 224 have a relatively large magnitude relative to the bulk potential 226, and may be characterized by the potential difference 228 therebetween. Because carriers in the PMOS device generally flow from source 110 to drain 112 in producing current flow (i.e., the carriers traverse both the bulk potential 226 and pocket potential barriers 222, 224), the high magnitude pocket potential barriers often regulate the amount of current that actually flows through the device.

Because the concentration of dopant atoms in the pocket implant regions is difficult to precisely control (e.g., due to statistical variations in the small number of atoms that make up the pocket region), the pocket potential barriers can vary widely from one transistor to another. This variation is bad for matching, particularly at low overdrive ($V_{GS}$-$V_T$) values used to save headroom in analog circuits.

While matched transistors are desirable, successful matching of transistors has been challenging to date due to these and other effects. In order to aid in the successful matching of transistors, aspects of the present invention relate to a general method 300 for matching transistors illustrated in FIG. 3. While this method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Method 300 is now described with reference to flow diagram (FIG. 3) and schematic representations (FIGS. 4A-4D), which are discussed in the context of a PMOS transistor for purposes of clarity and simplicity. The illustrated flow diagram shows general functional steps, while the schematic representations show what the transistor looks like during the various functional steps. It will be appreciated that while the method is discussed in the context of a PMOS transistor, the method is equally applicable to NMOS transistors, albeit with the polarities of the voltages reversed.

Figure 3:
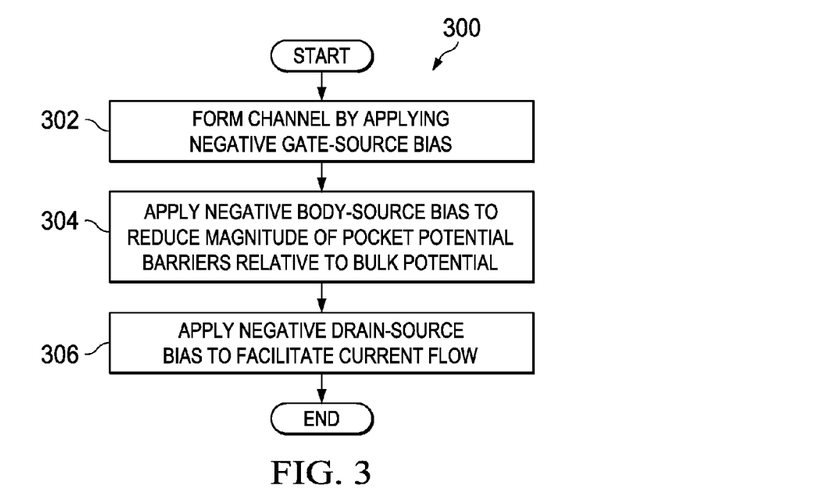
FIG. 3 shows a flow chart.

Referring now to FIG. 3, the method 300 starts at 302 where a negative gate-source bias is applied to the transistor to form a channel. In 304, a negative body-source bias is applied to the transistor to reduce the magnitude of the pocket potential barriers relative to the bulk potential. In 306, current flow is achieved by applying a negative drain-source bias.

Figure 4A:
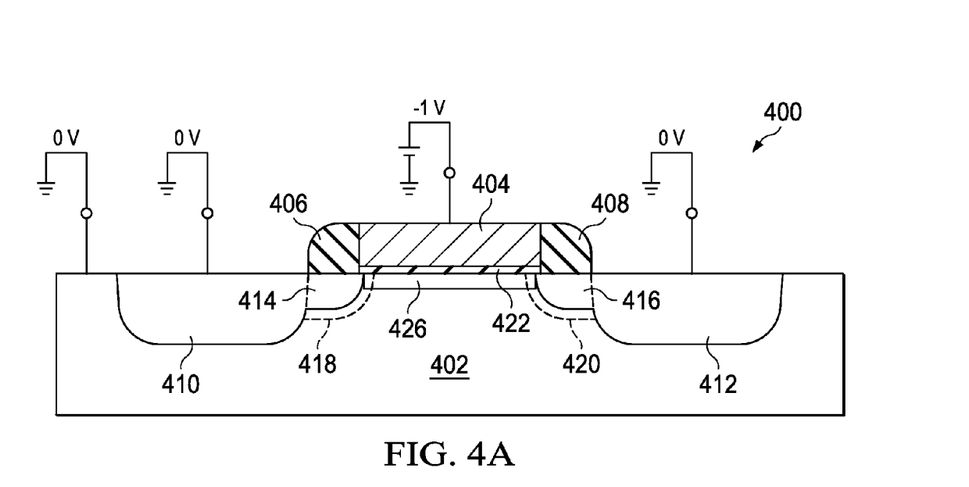
FIGS. 4A-4D show schematic representations of a transistor with various bias conditions applied thereto.
Figure 4B:
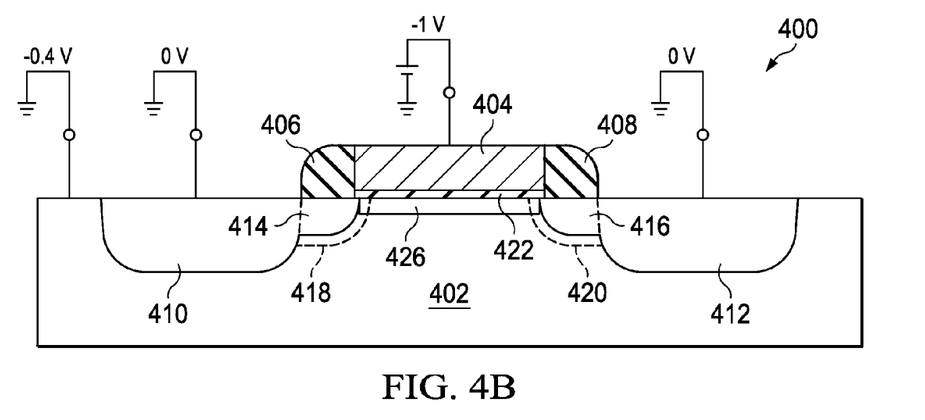
Figure 4C:
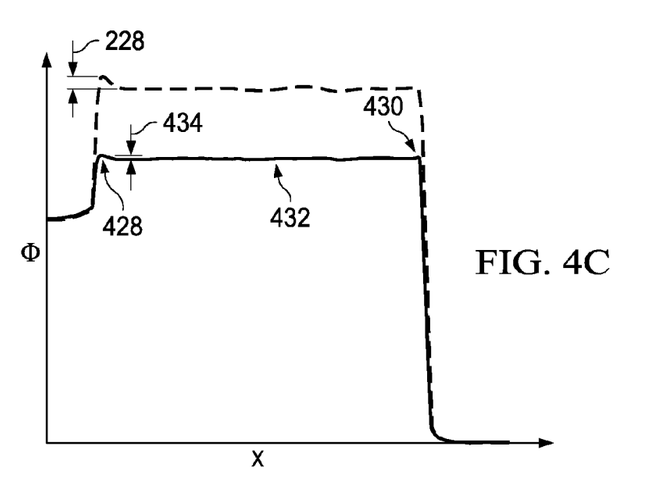

Referring now to FIG. 4A-4C, one can see a transistor 400 formed over a semiconductor body 402 and illustrative bias conditions in accordance with method 300 applied thereto. The transistor 400 includes a gate-electrode 404, spacers 406, 408 disposed about the lateral edges of the gate-electrode, and a source 410 and drain 412. The transistor further includes source-drain extensions 414, 416; pocket implant regions 418, 420 and a dielectric 422 that insulates the gate electrode 404 from a channel region of the device. The source 410 may be biased separately from the body 402. In one PMOS embodiment, the doping profile of the transistor 400 may be in accordance with that of FIG. 2B discussed earlier.

As shown in FIG. 4A, a channel 426 is formed when a negative gate-source bias is applied between the gate 404 and source 410 of the transistor 400. Although the illustrated gate-source bias is shown to be –1 V, it will be appreciated that the gate-source bias can vary widely depending on design constraints. For example, in various embodiments, the gate-source bias could range between approximately $V_T$+0.2 V and approximately $V_T$–0.5 V. In one embodiment, a gate-source bias of $V_T$+0.2 V relates to the sub-threshold transistor operation to improve voltage matching for a differential pair. In another embodiment, a gate-source bias of $V_T$–0.5 V relates to strong inversion for good current matching in a current mirror.

While the negative gate-source bias is applied, a forward body-source bias is also applied to the transistor, as shown in FIG. 4B. As shown, the source 410 is grounded at approximately 0 V while a negative bias is applied to the body 402, which forward biases the source-to-body pn junction. In the illustrated embodiment, a bias of approximately –0.4 V is applied to the body, although a wide range of values could be used depending on design constraints. For example, in other embodiments with a PMOS transistor, the body-source bias could range between approximately 0.0 V and approximately $-V_{diode}$ (where $V_{diode}$ is typically approximately 0.6 V to approximately 0.7 V). Note that the advantages of the present invention in terms of transistor matching are present regardless of the amount diode current through the source-body pn junction. However, additional considerations may restrict the range of forward body bias values that should be applied. For instance, a narrower $V_{BS}$ range of approximately 0.0 V to approximately –0.4 V may be applied to avoid the possibility of parasitic bipolar action such as latchup, or to minimize circuit power dissipation due to the diode current.

As shown in FIG. 4C (which like FIG. 2C shows the device in the off-state while $V_{DS}$ is applied), the result of this forward bias condition is that the magnitude of the pocket potential barriers 428, 430 relative to the bulk potential 432 for this transistor (difference 434) is decreased in comparison to that magnitude difference in the prior art procedures (difference 228). By decreasing the magnitude of this potential difference 434, variations in the concentration of the pocket implant regions will have less of an effect on transistor matching.

Figure 4D:
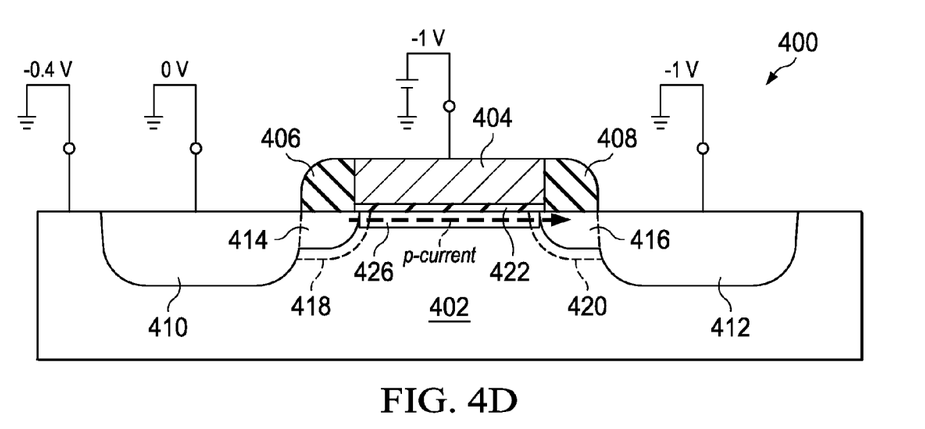

Therefore, to induce a matched current as shown in FIG. 4D, a negative voltage is applied to the drain 412 relative to the source 410 while the forward body-source bias is applied. Although a $V_{DS}$ bias of approximately −1 V is shown, other suitable biases could be applied depending on the implantation. Because the forward body-source bias has decreased potential difference 434 between the pocket potential barriers 428, 430 and the bulk potential 432, the current (p-current) will flow in a more predictive and more reliable manner. Therefore, the method can provide better matching between two or more transistors in an integrated circuit.

Although matched transistor 400 and methods for performing operations thereon have been illustrated and described, alterations and/or modifications may be made to these examples. For example, although transistor 400 has been shown as having an n-type body, a p-type source, and a p-type drain (i.e., a PMOS device); in other embodiments the doping conventions could be reversed. For example, the body could be a p-well formed in an n-type substrate, and the source and drain could be n-type (i.e., an NMOS device). Alternatively, the present invention could be used with an NMOS device that is placed with a p-well or a shallow p-well as the body, such that the body is contained within a deep n-well, isolating the body from a p-type substrate. In embodiments where the doping conventions are reversed (i.e., n-type transistors), it will be appreciated that the voltages described and illustrated could have opposite polarities (e.g., −1.0 V could become +1.0 V). Thus, in such embodiments, opposite polarities would likely be applied to the respective regions in order to facilitate desired functionality.

Figure 5A:
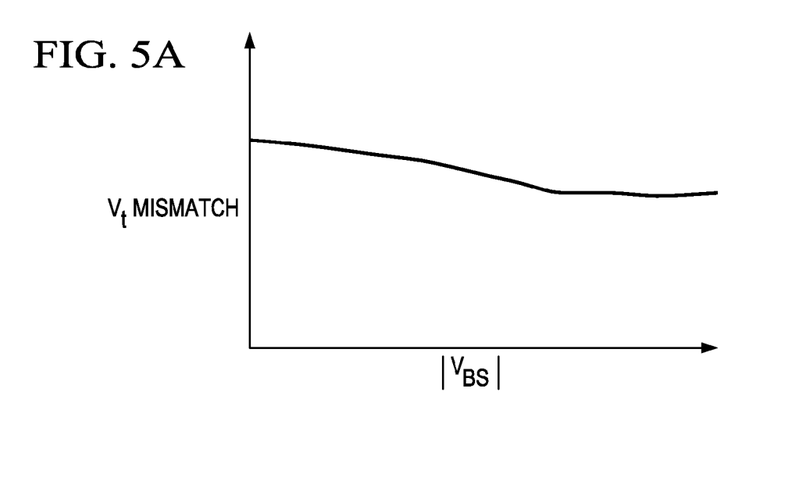
FIGS. 5A-5E show matching of various transistor characteristics as a function of $|V_{BS}|$.
Figure 5B:
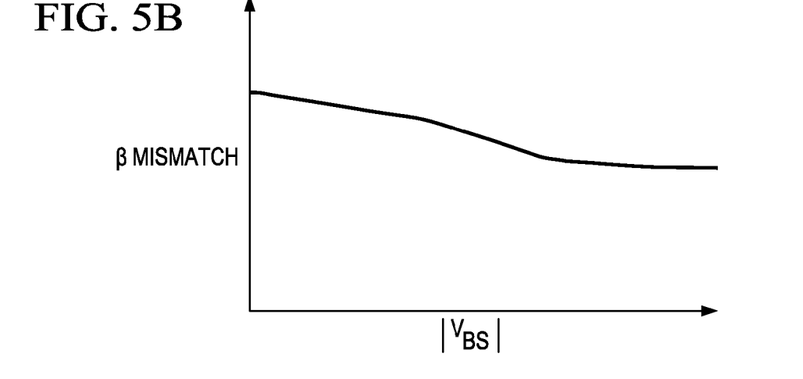
Figure 5C:
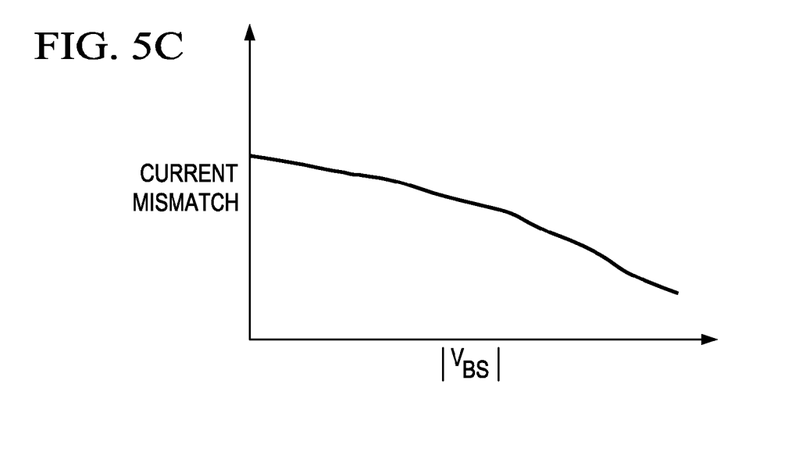

FIGS. 5A-5C show some examples of the impact that a forward body-source bias can have on the matching of PMOS transistors. More particularly, FIG. 5A shows one embodiment where the mismatch for $V_T$ of the devices decreases (i.e., parametric matching improves) as the magnitude of the forward body-source bias is increased. FIG. 5B shows another embodiment where the mismatch for the transistor drive strength $\beta$ ($\beta=\mu C_{ox}(W/L)$) of the devices decreases as the magnitude of the source-body bias is increased. Lastly, FIG. 5C shows still another embodiment where the current mismatch between the devices decreases as a function of magnitude of source-body bias.

Figure 5D:
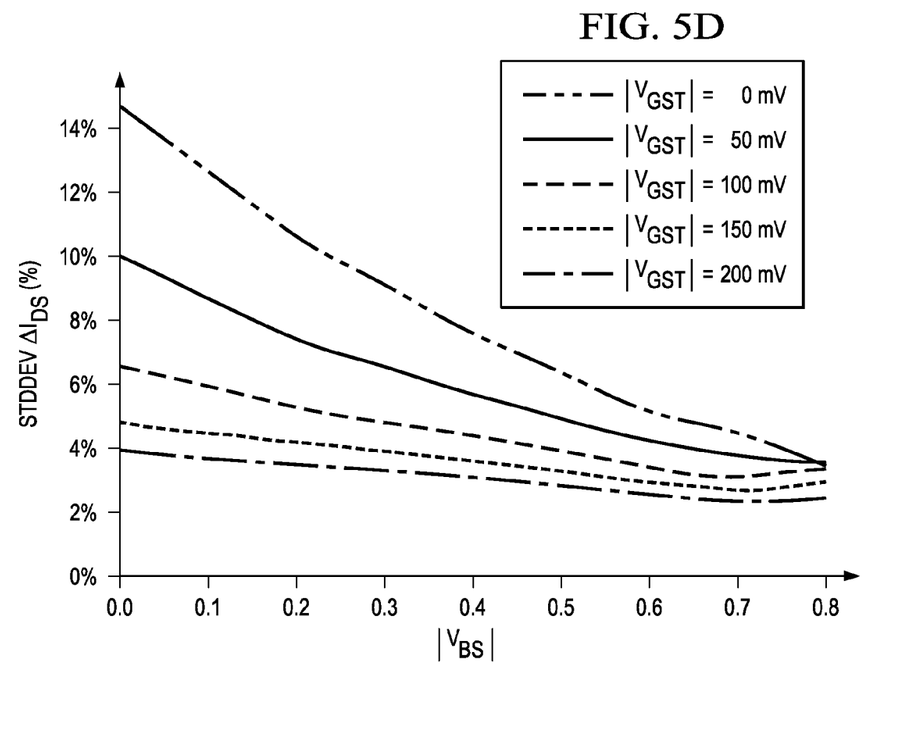
Figure 5E:
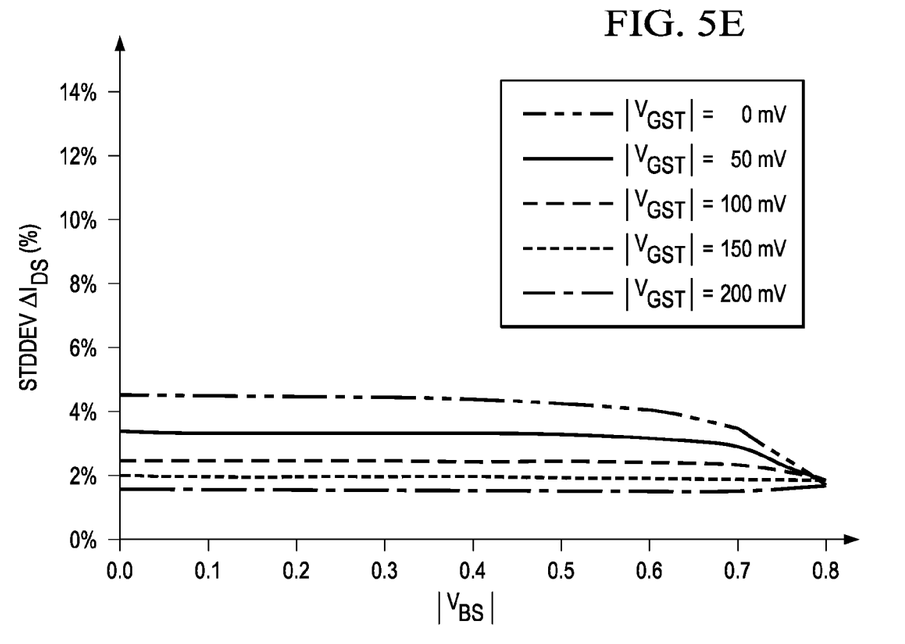

FIGS. 5D-5E show some examples of the impact that a forward body-source bias can have on the matching of a pair of PMOS transistors having pocket implant regions (FIG. 5D) relative to PMOS transistors not having pocket implant regions (FIG. 5E). Generally speaking, the figures each show a family of curves for various overdrives $|V_{GS}-V_T|$. The standard deviation of the current mismatch between pairs of transistors is shown on the y-axis, while the forward body-bias $|V_{BS}|$ is shown on the x-axis. In FIG. 5D, which relates to a pair of PMOS transistors having pocket implant regions, it can be seen that with no forward body-source bias ($|V_{BS}|=0$), matching is relatively poor. For example, when the overdrive $V_{GST}=0$ (sub-threshold matching) and $|V_{BS}|=0$, the standard deviation of $I_{DS}$ between geometrically matched transistors is projected to be approximately 14-15%. By increasing $|V_{BS}|$ to approximately 0.8 V, the standard deviation of $I_{DS}$ between the geometrically matched transistors is projected to be reduced to approximately 4%. By comparison, in FIG. 5E, which relates to a pair of PMOS transistors not having pocket implant regions, it can be seen that increasing $|V_{BS}|$ has a relatively small effect on matching. Therefore, the use of a forward body-source bias in the context of pocket implant regions differs from the use of a forward body bias without pocket implant regions.

Another way to understand the difference between FIGS. 5D and 5E is that the introduction of the pocket implant degrades transistor matching, and the use of forward substrate bias can recover the transistor matching to be closer to what would be obtained without the pocket implants. Such an effect has been obtained in the prior art by introducing two additional photomask levels to selectively block the pocket implant, but the cost of photomasks in new technologies is prohibitive. The present invention thus achieves a result that previously required two extra photomasks.

Figure 6:
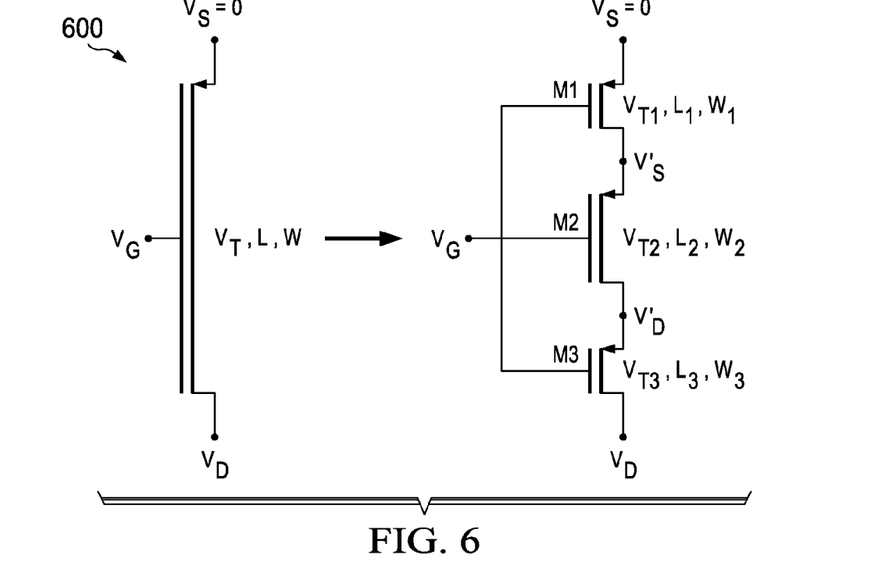
FIG. 6 shows a schematic from which a physical model was derived.

As shown in FIG. 6, the inventors have discerned the above behavior in part by modeling a single transistor 600 as three discrete devices (M1, M2, and M3) in series. As shown, two of these devices (M1 and M3) are intended to represent the pocket regions while the third device (M2) is intended to represent the bulk region. Each of the three devices (M1, M2, and M3) have voltage-thresholds ($V_{T1}$, $V_{T2}$, and $V_{T3}$, respectively), lengths ($L_1$, $L_2$, and $L_3$, respectively) and widths ($W_1$, $W_2$, and $W_3$, respectively) associated therewith. The overall transistor 600 has voltage threshold $V_T$, length L, and width W.

To model the overall behavior of the transistor, we start with the expressions for drain current $I_{DS}$ in the subthreshold region.

$$I_{DS} = I_t(W/L)\exp\left\{\frac{|V_G - V_S| - |V_T|}{kT/q}\right\}\left[1 - \exp\left\{-\frac{|V_D - V_S|}{kT/q}\right\}\right] \quad (1)$$

This expression, which can be used to represent the overall transistor 600 with an effective single value of $V_T$, is valid for $|V_G-V_S|<|V_T|$, which defines the subthreshold region of transistor operation. $I_t$ is a constant that sets the scale of the subthreshold current. Referring now to FIG. 6, we can write down the expressions for subthreshold conduction in the M1, M2, and M3 as follows:

$$I_{DS,1} = I_t(W/L)_1\exp\left\{\frac{|V_G - V_S| - |V_{T1}|}{kT/q}\right\}\left[1 - \exp\left\{-\frac{|V_S' - V_S|}{kT/q}\right\}\right] \quad (2)$$

$$I_{DS,2} = I_t(W/L)_2\exp\left\{\frac{|V_G - V_S'| - |V_{T2}|}{kT/q}\right\}\left[1 - \exp\left\{-\frac{|V_D' - V_S'|}{kT/q}\right\}\right] \quad (3)$$

$$I_{DS,3} = I_t(W/L)_3\exp\left\{\frac{|V_G - V_D'| - |V_{T3}|}{kT/q}\right\}\left[1 - \exp\left\{-\frac{|V_D - V_D'|}{kT/q}\right\}\right] \quad (4)$$

By setting these currents equal ($I_{DS,1}=I_{DS,2}=I_{DS,3}$), we can find the internal node voltages $V_S'$ and $V_D'$:

$$V_S' = \frac{kT}{q} \log \left[ \frac{\frac{\exp\left\{\frac{|V_{T1}|}{(kT/q)}\right\}}{(W/L)_1} + \frac{\exp\left\{\frac{|V_{T2}|}{(kT/q)}\right\}}{(W/L)_2} + \frac{\exp\left\{\frac{|V_{T3}|}{(kt/q)}\right\}}{(W/L)_3}}{\frac{\exp\left\{\frac{-|V_S|+|V_{T1}|}{(kT/q)}\right\}}{(W/L)_1} + \frac{\exp\left\{\frac{-|V_S|+|V_{T2}|}{(kT/q)}\right\}}{(W/L)_2} + \frac{\exp\left\{\frac{-|V_D|+|V_{T3}|}{(kT/q)}\right\}}{(W/L)_3}} \right] \quad (5)$$

$$V_D' = \frac{kT}{q} \log \left[ \frac{\frac{\exp\left\{\frac{|V_{T1}|}{(kT/q)}\right\}}{(W/L)_1} + \frac{\exp\left\{\frac{|V_{T2}|}{(kT/q)}\right\}}{(W/L)_2} + \frac{\exp\left\{\frac{|V_{T3}|}{(kt/q)}\right\}}{(W/L)_3}}{\frac{\exp\left\{\frac{-|V_S|+|V_{T1}|}{(kT/q)}\right\}}{(W/L)_1} + \frac{\exp\left\{\frac{-|V_D|+|V_{T2}|}{(kT/q)}\right\}}{(W/L)_2} + \frac{\exp\left\{\frac{-|V_D|+|V_{T3}|}{(kT/q)}\right\}}{(W/L)_3}} \right] \quad (6)$$

Substituting (5) into (1), we obtain an expression for $I_{DS,1}$, which must be equal to $I_{DS}$ of equation (1). Setting these equal ($I_{DS,1}=I_{DS}$) and solving for $V_T$, we obtain:

$$|V_T| = \frac{k_B T}{q} \ln \left\{ \frac{(W/L)}{(W/L)_1} e^{\frac{|V_{T1}|}{(kT/q)}} + \frac{(W/L)}{(W/L)_2} e^{\frac{|V_{T2}|}{(kT/q)}} + \frac{(W/L)}{(W/L)_3} e^{\frac{|V_{T3}|}{(kT/q)}} \right\} \quad (7)$$

Where (W/L) is the series combination of all three transistors' ratios $(W/L)_i$:

$$(W/L) = \frac{1}{\frac{1}{(W/L)_1} + \frac{1}{(W/L)_3} + \frac{1}{(W/L)_3}} \quad (8)$$

The $V_T$ mismatch in equation (7) was then calculated. To calculate this mismatch, the following assumptions were made: no correlation exists among fluctuations in $V_{T1}$, $V_{T2}$, and $V_{T3}$; pocket fluctuations $\delta V_{T1}$, $\delta V_{T3}$ are stronger than the bulk fluctuation $\delta V_{T2}$; (W/L) fluctuations were ignored due to the low $V_{GS}$–$V_T$ regime; and the same mismatch figure of merit ($A_{VT}$) value was used for all sub-transistors $$\left(\text{namely } \delta V_{t,i} = \frac{A_{VT}}{\sqrt{W_i L_i}}\right).$$

The overall $V_T$ mismatch can then be calculated as shown in Equation (9) below:

$$\delta V_T = \left(\frac{\partial V_t}{\partial V_{t1}}\right)^2 \delta V_{T1}^2 + \left(\frac{\partial V_t}{\partial V_{t2}}\right)^2 \delta V_{T2}^2 + \left(\frac{\partial V_t}{\partial V_{t3}}\right)^2 \delta V_{T3}^2, \quad (9)$$

which can be shown to become Equation (10) below:

$$\delta V_T = \frac{A_{VT}}{\sqrt{WL}} \frac{\sqrt{\left(\frac{L_1}{L}\right) e^{\frac{|2V_{T1}|}{(k_B T/q)}} + \left(\frac{L_2}{L}\right) e^{\frac{|2V_{T2}|}{(k_B T/q)}} + \left(\frac{L_3}{L}\right) e^{\frac{|2V_{T3}|}{(k_B T/q)}}}}{\left(\frac{L_1}{L}\right) e^{\frac{|V_{T1}|}{(k_B T/q)}} + \left(\frac{L_2}{L}\right) e^{\frac{|V_{T2}|}{(k_B T/q)}} + \left(\frac{L_3}{L}\right) e^{\frac{|V_{T3}|}{(k_B T/q)}}} \quad (10)$$

where we also have used $W_1=W_2=W_3=W$ and $L=L_1+L_2+L_3$ to simplify the expression.

After these calculations, it was decided to understand how the body effect would affect $V_T$ mismatch. Typically, the body effect changes $V_T$ according the following expression:

$$V_T = V_{T0} - \gamma \cdot |V_{BS}|^{1/2} \quad (11)$$

where $\gamma$, the body effect parameter, is proportional to the square root of Si doping. The sign before $\gamma$ in (11) is chosen so as to reduce the magnitude of $V_T$ when the source-body pn junction receives a forward bias, as in embodiments of the present invention. More particularly, $$\gamma = \frac{1}{C_{ox}} \sqrt{2q\varepsilon N_A}.$$

Therefore, the reduction in magnitude of $V_T$ you get with forward bias will be stronger in the heavier doped pocket regions than it will in the bulk.

Figure 7A:
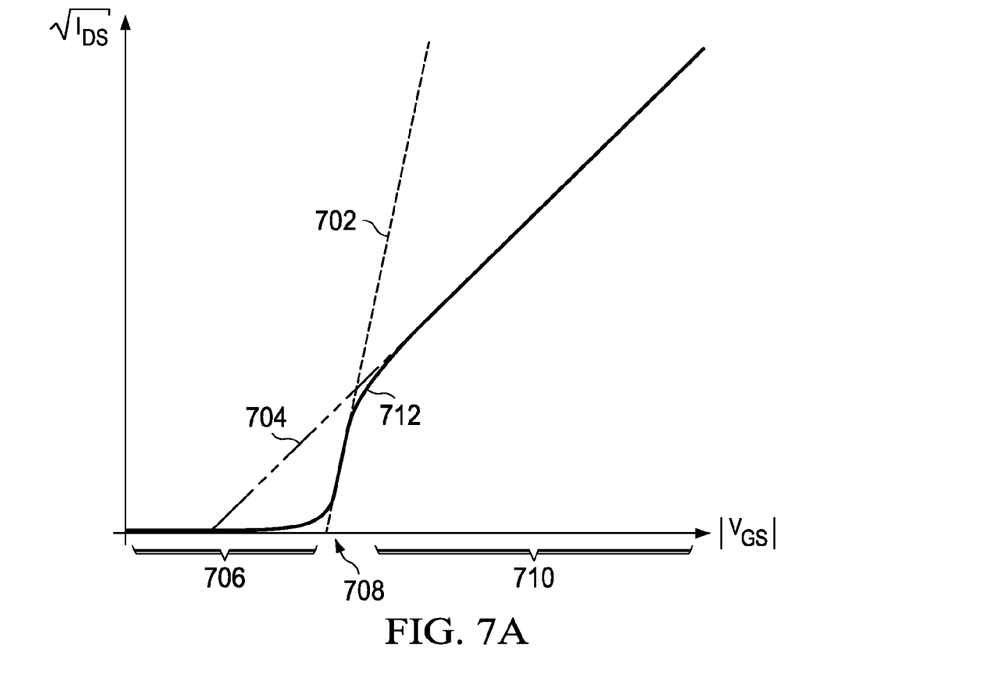
FIG. 7A-7B shows sets of current voltage curves.

This behavior is shown and discussed in more detail with reference to FIGS. 7A-7B, which relate to a drain-extended PMOS device (i.e., where pocket transistor M1 has a high $V_T$ and a high β, and bulk transistor M2 has a low $V_T$ and a low β, and we disregard pocket transistor M3). As shown in FIG. 7A, the I(V) curve 702 of the pocket transistor M1 has a steep slope when compared to the I(V) curve 704 of the bulk transistor M2. Thus, for relatively low $|V_{GS}|$ (706), even though bulk transistor M2 would be "on", the pocket transistor M1 is in cutoff (i.e., "off") and no current will flow through the drain extended PMOS device. As $|V_{GS}|$ is increased (708), the pocket transistor M1 goes through sub-threshold conduction and then "turns on" when the square root of its current increases linearly with $|V_{GS}|$. Thus, in region 708, the pocket transistor M1 limits the current through the device. As $|V_{GS}|$ increases even more (710), the bulk transistor M2 enters saturation and establishes the maximum current through the device. The composite curve 712 shows the dynamic relationship of the pocket transistor M1 and bulk transistor M2 in series.

Figure 7B:
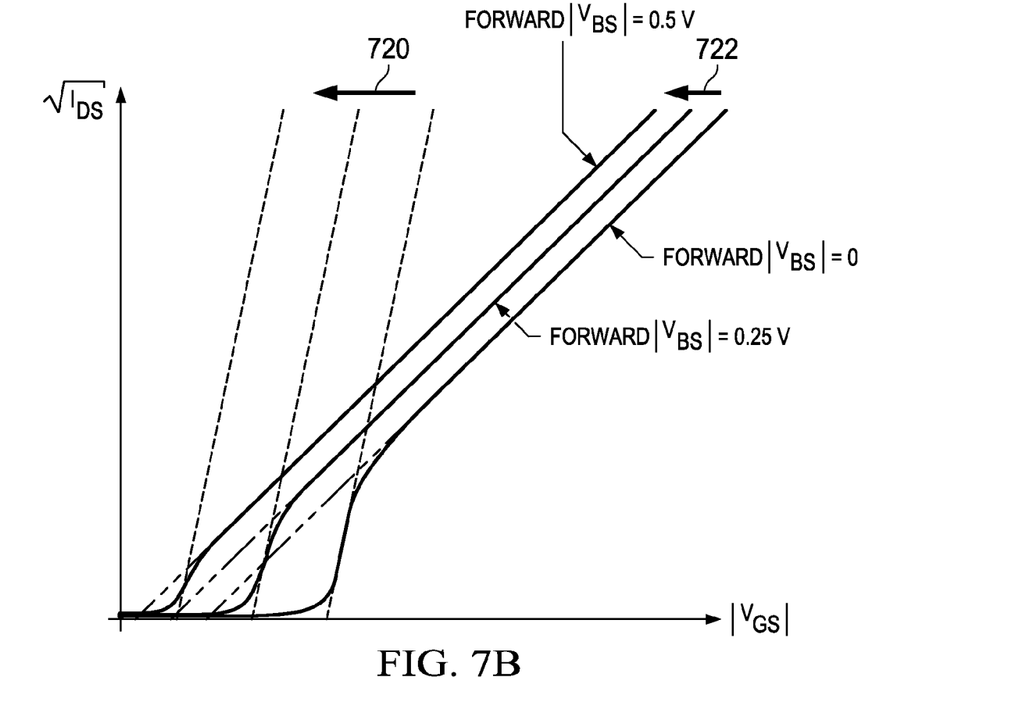

FIG. 7B shows the impact of forward body bias on the current from the drain-extended PMOS device. Specifically, FIG. 7B shows three I(V) curves for each of the pocket transistor M1, bulk transistor M2, and composite device. As shown, the $|V_T|$ of the pocket transistor M1 drops faster (720) per unit $|V_{BS}|$ than does the $|V_T|$ of the bulk transistor M2, which drops slower (722) per unit $|V_{BS}|$. This differing response of $V_T$ to forward body bias results in lowering the pocket barrier height 434 in FIG. 4C relative to the original barrier height 228, for which $V_{BS}=0$. Therefore, one can appreciate that by applying the forward body bias, the effect of the pocket region is diminished relative to the bulk region, thereby achieving better matching.

Now that several methods and devices for transistor matching have been set forth, several practical examples of implementations in which these methods and devices could be employed are set forth. It will be appreciated that these examples are merely illustrative. Many other systems could also employ these matching devices and techniques as set forth above.

Figure 8A:
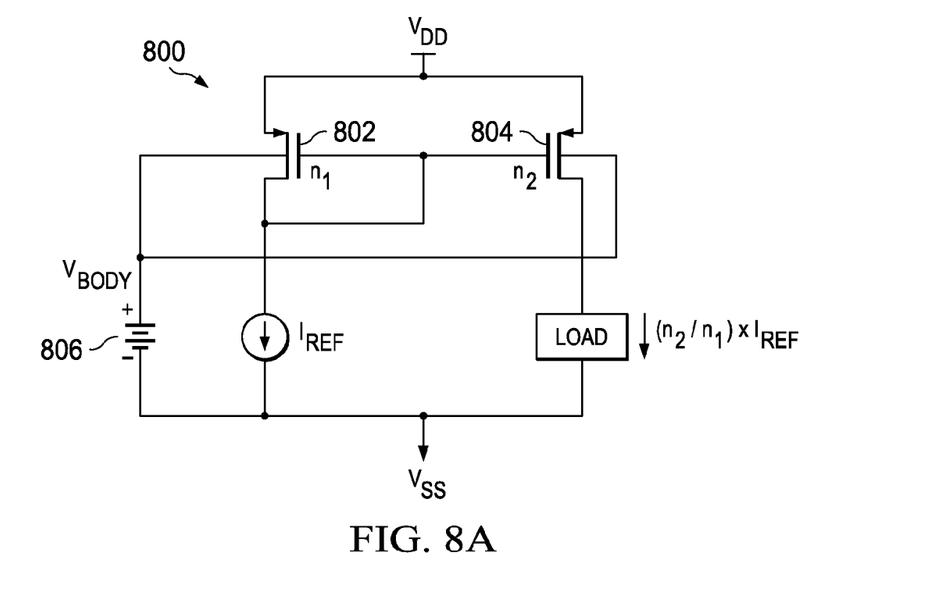
FIGS. 8A-8B show schematic representations of current mirrors.

In FIG. 8A, for example, one can see a current mirror 800 that employs aspects of the previously discussed bias methods. Thus, in the illustrated embodiment, the body of the transistors 802, 804 can be biased independently of the source. More specifically, a forward body-source bias ($V_{BS}$) can be applied to the PMOS current mirror transistors using a voltage source 806 tied to an n-well of the transistors. As shown, the current through the load is proportional to the ratio of currents n1, n2 entering the drains of transistors 802, 804. Therefore, if the devices are "matched", the current flowing through the load will be equal to $(n_2/n_1)I_{REF}$. In one embodiment where the diode drop is about 0.7 V, $V_{body}$ could lie between $(V_{DD})$ and $(V_{DD}-0.7V)$. Note that an analogous circuit could also be constructed using a NMOS with a p-well body built in an isolating n-well, albeit with the polarity of the voltages switched.

Figure 8B:
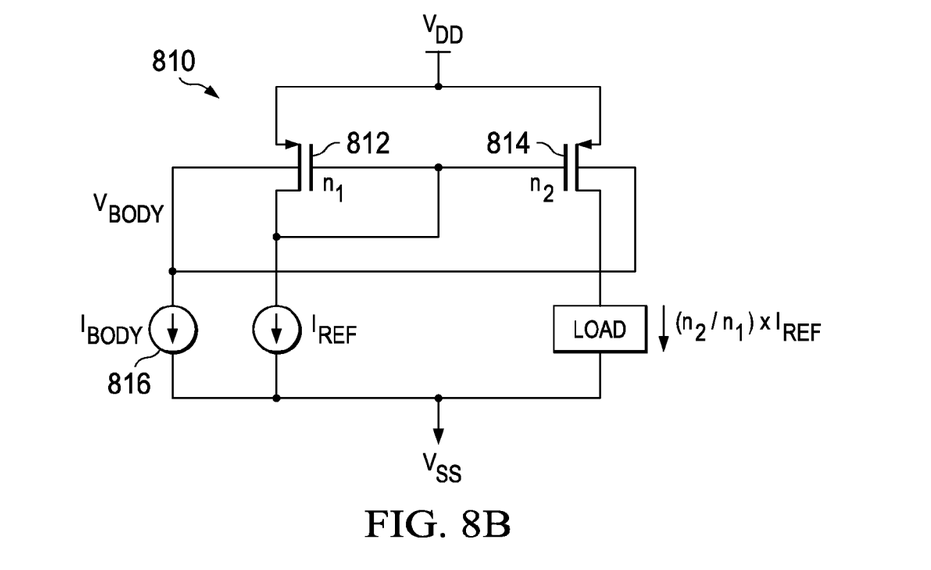

FIG. 8B shows another embodiment of a current mirror 810 in which the forward body bias is applied to the PMOS current mirror transistors 812, 814 using a current source 816 tied to the n-well. In one such embodiment, $I_{body}$ sets the potential for $V_{body}$ of the well by forward biasing the source-body diodes in the PMOS mirror transistors through the following relationship:

$$I_{body} = \sum_{transistors} I_s e^{\frac{V_{DD}-V_{body}}{kT}} \quad (5)$$

where $I_s$ is the source-body diode saturation current. Again, note that an analogous circuit can be constructed using NMOS transistors with an isolating n-well, provided the polarities of the voltages are switched.

Figure 9A:
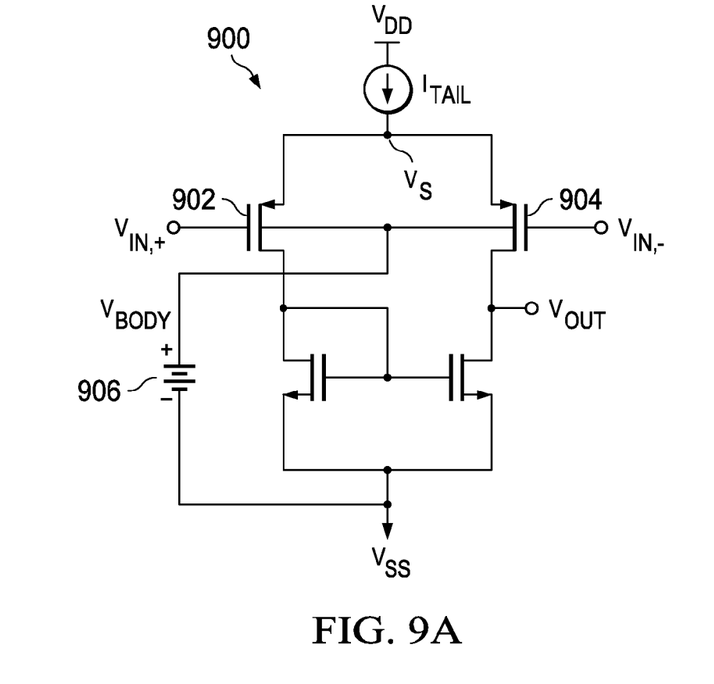
FIGS. 9A-9B show schematic representations of differential pairs.

FIG. 9A shows another embodiment in which a differential pair 900 employs aspects of the previously discussed techniques. In the illustrated embodiment, the forward $V_{BS}$ bias can be applied to the PMOS differential pair transistors 902, 904 using a voltage source 906 tied to the n-well. Often a designer can use a combination of transistor sizing and $I_{tail}$ selection such that the differential pair is in weak inversion or in the sub-threshold region, which may reduce voltage mismatch between the transistors. $V_{body}$ will typically lie between $(V_s)$ and $(V_s-V_{diode})$, where $V_{diode}$ is typically about 0.7 V. As shown, $V_S$ is the node joining the tail current source and the sources of the pair. An analogous circuit could be constructed using NMOS transistors in a p-well built in an isolating n-well. Note that depending on the scenario, it may be useful to use the differential pair in strong inversion, weak inversion, and sub-threshold operation.

Figure 9B:
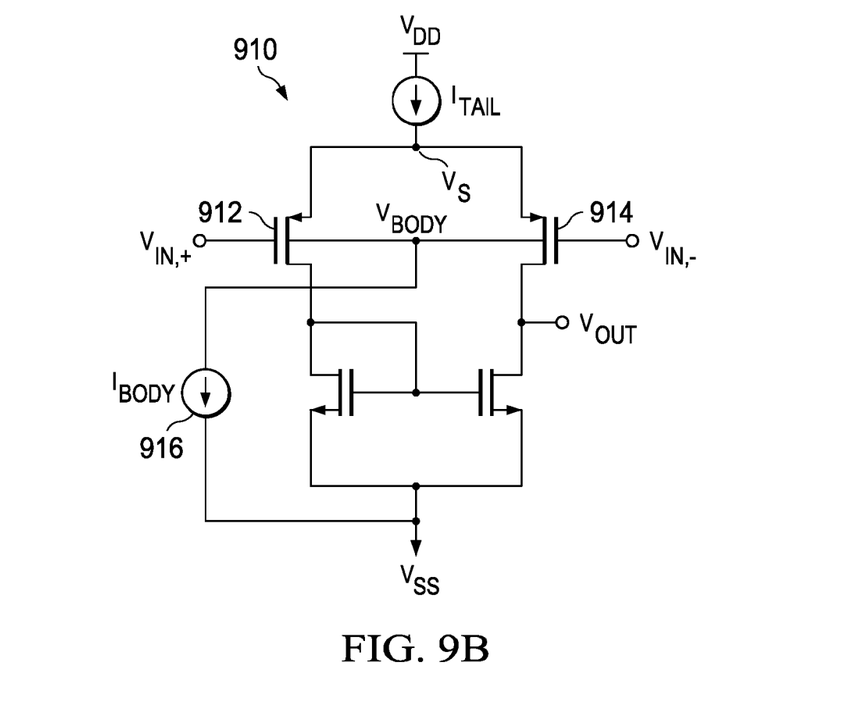

FIG. 9B shows another embodiment of a differential pair 910 in which the forward body bias is applied to the PMOS differential pair transistors 912, 914 using a current source 916 tied to the n-well. Since $I_{body}$ shares part of $I_{tail}$ with the differential pair, it may be advantageous to build the $I_{body}$ current source such that it is derived from a fixed fraction of $I_{tail}$. An example of how to do this is by using current replication circuitry (current mirrors) with transistor width ratios chosen to set the desired ratio of $(I_{body}/I_{tail})$, which will lie between 0 and 1. Again, an analogous circuit could be constructed using NMOS transistors in a p-well built in an isolating n-well.

Figure 10:
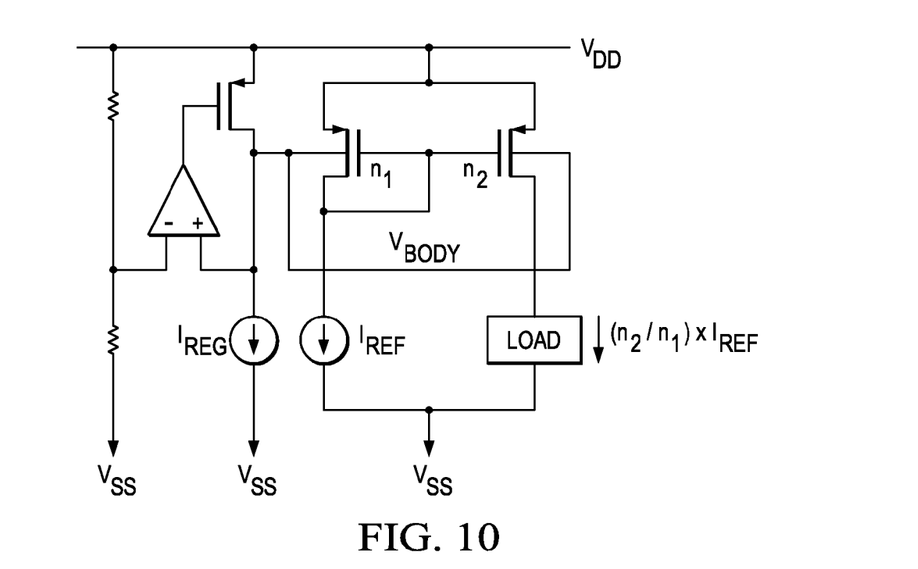
FIG. 10 shows a schematic representation of a PMOS voltage regulator.

Generally speaking, there are numerous ways in which the voltage sources or current sources may be implemented. For example, illustrative voltage sources for body bias control could utilize a resistor divider string, a diode-connected PMOS string, or a bandgap reference. To control the NWELL potential, a simple PMOS voltage regulator could be used using any voltage reference (see FIG. 10). For the case of an NMOS in a PWELL isolated in a deep NWELL, the isolated PWELL potential may be controlled by a simple NMOS voltage regulator using any voltage reference.

Figure 11:
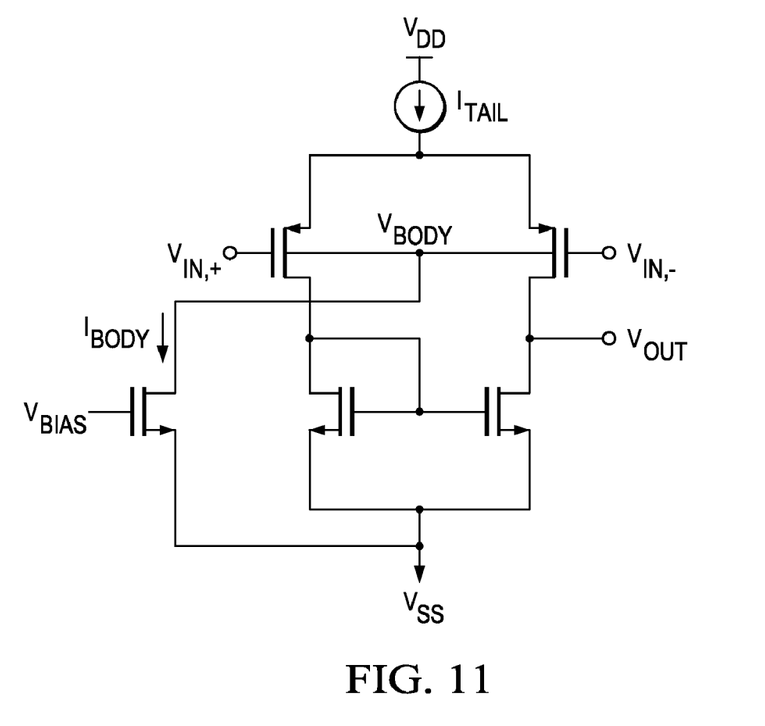
FIG. 11 shows a schematic representation of an NMOS current source.

Illustrative current sources for body bias control could use an NMOS current source with a drain tied to NWELL of a PMOS current mirror or differential pair (see FIG. 11). In the embodiment, the bias voltage $V_{BIAS}$ could be created by current replication circuitry that could cause $I_{TAIL}$ and $I_{body}$ to have a fixed relationship. For the case of an isolated NMOS in a PWELL isolated by a deep NWELL, the PWELL potential may be controlled using a PMOS current source with the drain tied to the isolated PWELL. Note that using a current source for body bias control confers the advantage of limiting current draw, since the diode current goes exponentially with body-source potential.

In typical embodiment, any bias generating circuit used to set biasing currents or potentials can use the same body potential for any components that need to be electrically matched to components in the circuit of interest.

In other un-illustrated embodiments, drain extended devices (DE-PMOS, DE-NMOS) may be used in place of more PMOS or NMOS devices discussed. Charge pumps or other supply voltages may be used to induce forward body bias by pulling the source of the device of interest outside of $[V_{SS}, V_{DD}]$. For example, in an NMOS device utilizing a charge pump, the source can be pulled negative. By contrast, in a PMOS device utilizing a charge pump, the source can be pulled above $V_{DD}$.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for matching transistors in an integrated circuit, comprising:

forming a plurality of transistors over a semiconductor body, the transistors each comprising matched configurations of a gate electrode; spacers disposed about lateral edges of the gate electrode; pocket implant regions formed in the body substantially under the spacers and having pocket potential barriers associated therewith; and a source and a drain formed in the body and disposed laterally from the pocket implant regions; and applying a body-source bias to forward bias a pn junction between the source and body of each transistor, which forward bias reduces a magnitude of at least one of the pocket potential barriers associated with the pocket implant regions relative to a bulk potential of that transistor; whereby differences in source-to-drain current flow between ones of the transistors will be less affected by variations in concentrations of dopant in the respective pocket implant regions.

2. The method of claim 1, wherein the transistors are configured to act as analog devices having a continuum of states.

3. The method of claim 1, where the bulk potential of each transistor is associated with a bulk region that is disposed between the pocket implant regions.

4. The method of claim 3, wherein the bias reduces a magnitude of the at least one pocket potential baffler more than a magnitude of the bulk potential.

5. The method of claim 1, wherein the transistors are long-channel transistors.

6. The method of claim 1, wherein each transistor further comprises a source extension region and a drain extension region respectively adjacent to its source and drain.

7. The method of claim 1, wherein the circuit comprises a current mirror.

8. The method of claim 1, wherein the circuit comprises a differential pair.

9. A method for matching transistors in an integrated circuit, comprising:

forming first and second transistors over a semiconductor body, the first and second transistors comprising respective matched configurations of gate electrodes; spacers disposed about lateral edges of the gate electrodes; pocket implant regions formed in the body substantially under the spacers and having pocket potential barriers associated therewith; bulk regions disposed between the pocket implant regions and characterized by bulk potentials; and sources and drains formed in the body and disposed laterally from the pocket implant regions;

forming a channel within each of the first and second transistors by applying a gate-source bias having a first polarity to each transistor;

reducing a magnitude of at least one of the potential barriers in the pocket implant region of each transistor relative to the bulk potential of the respective transistor, by applying a body-source bias having the first polarity; and facilitating current flow across the channel of each transistor by applying a drain-source bias having the first polarity.

10. The method of claim 9, wherein the current flow in the first transistor is approximately equal to the current flow in the second transistor.

11. The method of claim 9, wherein the first and second transistors have voltage thresholds that are approximately matched.

12. The method of claim 9, wherein the bias reduces a magnitude of the at least one pocket potential baffler more than a magnitude of the bulk potential.

* * * * *